United States Patent
Annunziata et al.

(10) Patent No.: US 9,698,339 B1
(45) Date of Patent: Jul. 4, 2017

(54) MAGNETIC TUNNEL JUNCTION ENCAPSULATION USING HYDROGENATED AMORPHOUS SEMICONDUCTOR MATERIAL

(71) Applicants: International Business Machines Corporation, Armonk, NY (US); Samsung Electronics Co., Ltd., Suwon-si, Gyeonggi-do (KR)

(72) Inventors: Anthony J. Annunziata, Stamford, CT (US); Marinus Hopstaken, Carmel, NY (US); Chandrasekara Kothandaraman, New York, NY (US); JungHyuk Lee, Seoul (KR); Deborah A. Neumayer, Danbury, CT (US); Jeong-Heon Park, Seoul (KR)

(73) Assignees: INTERNATIONAL BUSINESS MACHINES CORPORATION, Armonk, NY (US); SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/982,540

(22) Filed: Dec. 29, 2015

(51) Int. Cl.
*H01L 43/02* (2006.01)
*H01L 43/08* (2006.01)
*H01L 43/12* (2006.01)

(52) U.S. Cl.
CPC ............. *H01L 43/08* (2013.01); *H01L 43/02* (2013.01); *H01L 43/12* (2013.01)

(58) Field of Classification Search
None
See application file for complete search history.

(56) References Cited

U.S. PATENT DOCUMENTS

| 5,744,202 | A  | 4/1998  | Nickel et al.  |
| 5,820,980 | A  | 10/1998 | Asakawa et al. |
| 6,783,995 | B2 | 8/2004  | Hineman et al. |
| 8,803,297 | B2 | 8/2014  | Nelle et al.   |

(Continued)

FOREIGN PATENT DOCUMENTS

| JP | H10676378 A    | 3/1994  |
| JP | 2009120482 A   | 6/2009  |
| WO | 2014174938 A1  | 10/2014 |

*Primary Examiner* — Michael Lebentritt
(74) *Attorney, Agent, or Firm* — Cantor Colburn LLP; Vazken Alexanian

(57) ABSTRACT

Embodiments are directed to an electromagnetic memory device having a memory cell and an encapsulation layer formed over the memory cell. The memory cell may include a magnetic tunnel junction (MTJ), and the encapsulation layer may be formed from a layer of hydrogenated amorphous silicon. Amorphous silicon improves the coercivity of the MTJ but by itself is conductive. Adding hydrogen to amorphous silicon passivates dangling bonds of the amorphous silicon, thereby reducing the ability of the resulting hydrogenated amorphous silicon layer to provide a parasitic current path to the MTJ. The hydrogenated amorphous silicon layer may be formed using a plasma-enhanced chemical vapor deposition, which can be tuned to enable a hydrogen level of approximately 10 to approximately 20 percent. By keeping subsequent processing operations at or below about 400 Celsius, the resulting layer of hydrogenated amorphous silicon can maintain its hydrogen level of approximately 10 to 20 percent.

17 Claims, 4 Drawing Sheets

(56) References Cited

U.S. PATENT DOCUMENTS

| | | | |
|---|---|---|---|
| 9,450,180 B1* | 9/2016 | Annunziata | H01L 43/12 |
| 2002/0121662 A1* | 9/2002 | Rosner | B82Y 10/00 |
| | | | 257/329 |
| 2007/0048604 A1 | 3/2007 | Gaillard et al. | |
| 2011/0233507 A1* | 9/2011 | Sonehara | H01L 27/224 |
| | | | 257/4 |
| 2014/0061827 A1 | 3/2014 | Huang et al. | |
| 2014/0084398 A1* | 3/2014 | Oguz | H01L 43/12 |
| | | | 257/421 |
| 2014/0295636 A1* | 10/2014 | Makala | H01L 29/66833 |
| | | | 438/287 |
| 2015/0069317 A1* | 3/2015 | Inaba | H01L 29/4236 |
| | | | 257/4 |
| 2016/0181272 A1* | 6/2016 | Rabkin | H01L 21/02653 |
| | | | 438/268 |
| 2016/0315088 A1* | 10/2016 | Kang | H01L 27/10814 |

* cited by examiner

DEPOSIT a:Si-H

DEPOSIT SiN

MAGNETIC TUNNEL JUNCTION ENCAPSULATION USING HYDROGENATED AMORPHOUS SEMICONDUCTOR MATERIAL

BACKGROUND

The present disclosure relates generally to electronic memory technology, and more specifically to the introduction of a hydrogenated amorphous semiconductor material encapsulation layer to a memory cell to improve its coercivity and other performance characteristics.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a transistor, a magnetic tunnel junction (MTJ) device (i.e., memory cell) for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of the MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism.

The term "magnetoresistance" describes the effect whereby a change to certain magnetic states of the MTJ storage element results in a change to the MTJ resistance, hence the name "Magnetoresistive" RAM. A typical MTJ structure includes a stacked configuration having a fixed magnetic layer (e.g., Fe, CoFe, CoFeB, etc.), a thin dielectric tunnel barrier (e.g., MgO) and a free magnetic layer (e.g., Fe, CoFe, CoFeB, etc.). The MTJ has a low resistance when the magnetic moment of its free layer is parallel to the magnetic moment of its fixed layer. Conversely, the MTJ has a high resistance when its free layer magnetic moment is oriented anti-parallel to its fixed layer magnetic moment. The MTJ can be read by activating its associated word line transistor, which switches current from a bit line through the MTJ. The MTJ resistance can be determined from the sensed current, which is itself based on the polarity of the free layer. Conventionally, if the fixed layer and free layer have the same polarity, the resistance is low and a "0" is read/written. If the fixed layer and free layer have opposite polarity, the resistance is higher and a "1" is read/written.

A practical MRAM or STT-MRAM device integrates a plurality of magnetic memory elements with other circuits such as, for example, control circuits for the magnetic memory elements, comparators for detecting the states in the magnetic memory elements, input/output circuits and miscellaneous support circuitry. As a result, a variety of microfabrication processing challenges must be overcome before high capacity/density MRAM products become commercially available. For example, CMOS technology is typically required in order to reduce the power consumption of the device and provide a variety of support functions. As is known in the art, various CMOS processing steps (such as annealing implants) are carried out at temperatures in excess of 300 Celsius. On the other hand, ferromagnetic materials employed in the fabrication of MRAM devices, such as CoFe and NiFeCo for example, require substantially lower process temperatures in order to prevent intermixing of magnetic materials. Thus, the magnetic memory elements are designed to be integrated into the back-end-of-line (BEOL) wiring structure following front-end-of-line (FEOL) CMOS processing.

MTJs contain component layers that are easily oxidized and also sensitive to corrosion. To protect MTJ memory cells from BEOL fabrication steps and performance degradation over time, as well as maintain post-fabrication performance and reliability of the MRAM device, it is desirable to form during fabrication an encapsulation layer over the memory cell. Silicon nitride and similar compounds are desirable as encapsulation materials for their adhesion to MTJ metal surfaces, and for their strong interfacial bonds that inhibit migration of metal atoms along the dielectric/metal interfaces of the MTJ. Such metal migration is a known cause of MTJ thermal degradation, and can limit processing temperatures in patterned MTJ memory cells to below 300° C.

To prevent degradation of the MTJ memory cell, BEOL thermal budget for MRAM devices (e.g., <about 250 Celsius to about 300 Celsius) is significantly lower than for conventional semiconductor fabrication processes (~400 Celsius). This can affect the intrinsic quality of dielectrics being used in the BEOL, and can worsen seams and void formations around the topographical features that are being encapsulated. Low thermal budget also prevents the use of certain post-processing passivation anneals, and packaging materials and processes.

In addition to fabrication techniques that protect the memory cell during fabrication, maintain post-fabrication performance and maintain reliability, it would be beneficial to provide fabrication techniques and resulting device structures and characteristics that improve post-fabrication performance and reliability. For example, stability of the MTJ device is increased by improving its coercivity (HO. Coercivity is the intensity of the applied magnetic field required to reduce the magnetization of that material to zero after the magnetization of the sample has been driven to saturation. Thus, improving coercivity improves the resistance of a ferromagnetic material to becoming demagnetized. It would be further beneficial to provide such fabrication techniques and resulting device structures and characteristics without significantly increasing the BEOL thermal budget.

SUMMARY

Embodiments are directed to an electromagnetic memory device having a memory cell and an encapsulation layer formed over the memory cell, wherein the encapsulation layer includes a layer of hydrogenated amorphous semiconductor material.

Embodiments are further directed to an electromagnetic memory device having a memory cell formed on a substrate, an encapsulation layer formed over the memory cell and an insulation layer formed over the encapsulation layer, wherein the encapsulation layer includes a layer of hydrogenated amorphous semiconductor material.

Embodiments are further directed to a method of forming an electromagnetic memory device. The method includes forming a memory cell, forming an encapsulation layer over the memory cell and forming the encapsulation layer from a layer of hydrogenated amorphous semiconductor material.

Additional features and advantages are realized through the techniques of the present disclosure. Other embodiments and aspects of the disclosure are described in detail herein and are considered a part of the claimed subject matter. For a better understanding, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features and advantages are apparent from the following detailed description taken in conjunction with the accompanying drawings in which:

DETAILED DESCRIPTION

Figure 1:
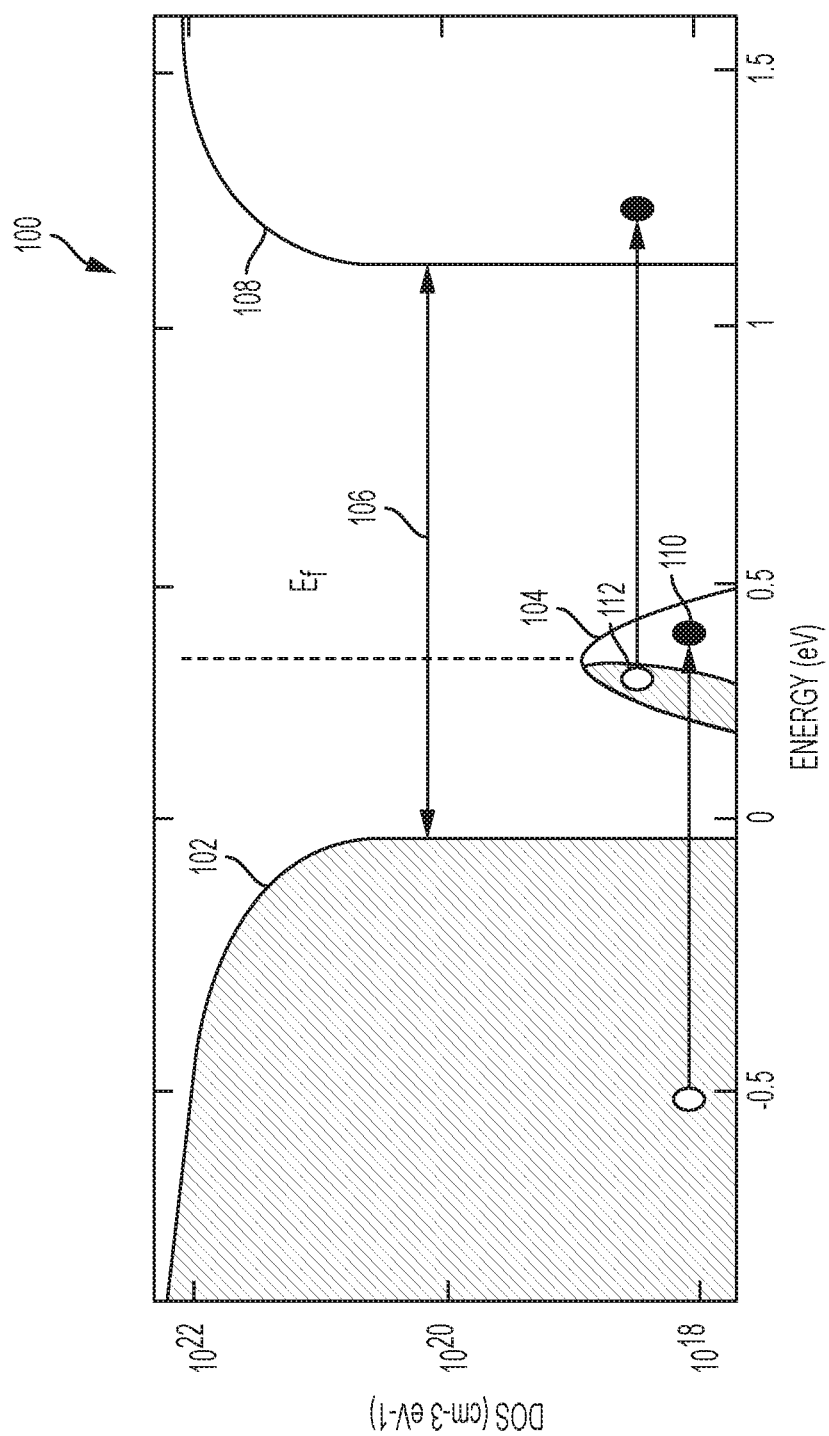
FIG. 1 is a plot illustrating hopping conduction in amorphous silicon.

Embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements described in the present disclosure and illustrated in the accompanying drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Although this disclosure includes a detailed description of an exemplary MTJ configuration of the disclosed memory cell, implementation of the teachings recited herein are not limited to the particular memory cell structure disclosed herein. Rather, embodiments of the present disclosure are capable of being implemented in conjunction with any other type of memory cell structure now known or later developed. Additionally, although disclosed embodiments focus on MRAM memory cell applications, the teachings of the present disclosure apply equally to STT-MRAM memory cells and other memory cell configurations. Additionally, although disclosed embodiments focus on silicon semiconductor material, the teachings of the present disclosure apply to semiconductor materials other than silicon.

For the sake of brevity, conventional techniques related to MTJ, MRAM and/or STT-MRAM semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based MTJ memory cells and MRAM or STT_MRAM structures are well known and so, in the interest of brevity, many conventional steps will only be mentioned briefly herein or will be omitted entirely without providing the well-known process details.

Turning now to an overview of the present disclosure, one or more embodiments are directed to an electromagnetic memory device having a memory cell and an encapsulation layer formed over the memory cell. The memory cell may include a magnetic tunnel junction (MTJ), and the encapsulation layer may be formed from a layer of hydrogenated amorphous silicon. Including amorphous silicon in the encapsulation layer improves the coercivity of the MTJ, which reduces the likelihood that ferromagnetic elements of the MTJ will demagnetize over time. However, by itself, amorphous silicon is conductive, which is undesirable. According to the present disclosure, hydrogen is included in the amorphous silicon encapsulation layer to passivate dangling bonds of the amorphous silicon, thereby reducing its conductance, as well as reducing the ability of the resulting hydrogenated amorphous silicon encapsulating layer to provide a parasitic current path to the MTJ. Further according to the present disclosure, the hydrogenated amorphous silicon layer is formed using a plasma-enhanced chemical vapor deposition (PECVD), which can be tuned to enable a hydrogen level of approximately 10 to approximately 20 percent. By keeping subsequent (i.e., BEOL) processing operations at or below about 400 Celsius, the resulting layer of hydrogenated amorphous silicon can maintain a post-BEOL hydrogen level at the pre-BEOL hydrogen level of approximately 10 to 20 percent.

Turning now to a more detail description of the present disclosure, FIG. 1 is a plot 100 illustrating so-called "hopping conduction" in amorphous silicon. More specifically, plot 100 shows an example of the density of states (DOS) vs. the electron energy (eV) for amorphous silicon. Plot 100 includes a valence band 102, a grain boundary band 104 formed from localized defect states (e.g., 110, 112) of the amorphous silicon, a band gap 106 and a conduction band 108. $E_f$ is the Fermi energy, which roughly denotes the transition between occupied and unoccupied defect states (e.g., 110, 112) in grain boundary band 104. The shading underneath valence band 102, grain boundary band 104 and conduction band 108 indicates a density of the occupied electron states of the band. Plot 100 illustrates how electromagnetic energy can be absorbed by amorphous silicon material, thereby resulting in hopping conduction through the amorphous silicon material. Although plot 100 is developed for silicon, a similar plot may be developed for other semiconductor materials.

In solid-state physics, a band gap is typically an energy range in a solid where no electron states can exist. As shown in FIG. 1 (moving from left to right), band gap 106 is the energy difference between the top of valence band 102 and the bottom of conduction band 108. If the valence band is completely full and the conduction band is completely empty, electrons cannot move in the solid. However, if some electrons transfer from the valence band to the conduction band, current can flow. Therefore, the size of the band gap is a major factor in determining the electrical conductivity of a solid. Substances with large band gaps are generally insulators, and substances with smaller band gaps are semiconductors. Substances that are conductors have either very small band gaps or none.

Materials may be characterized as crystalline, polycrystalline or amorphous. A crystal or crystalline solid is a solid material having constituent atoms, molecules or ions arranged in an ordered pattern extending in all three spatial dimensions. When the periodicity in the crystal structure is interrupted at so-called grain boundaries, the crystal is said to be polycrystalline. A polycrystalline solid is a solid material having constituent atoms, molecules or ions are arranged in many ordered patterns fused together into a single solid. An amorphous or non-crystalline solid is a solid material having constituent atoms, molecules or ions having no periodic structure whatsoever.

In crystalline materials, conduction can occur when sufficient electromagnetic energy (e.g., ≥band gap 106) is applied to raise or excite electrons in valence band 102 across band gap 106 into conduction band 108. However, when the silicon is amorphous, there are grain boundaries and associated localized states, which are represented by grain boundary band 104 formed from localized defect states (e.g., 110, 112) of the amorphous silicon. There are also band tails (not shown) at the bottom of valance band 102 and conduction band 108. These band tails, grain boundaries and grain boundary localized defect states provide a hopping conduction threshold much lower than band bap 106, making it easier to raise or excite electrons in valence band 102 to an unoccupied defect state (e.g., 110) within grain boundary band 104, and also raise or excite electrons from an occupied defect state (e.g., 112) within grain boundary band 104 into conduction band 108. Accordingly, these localized defect states provide a current path for lower threshold energy to moving electrons from valence band 102 through unoccupied defect states (e.g., 110 or 112) of grain boundary band 104 to unoccupied defect states of conduction band 108.

Figure 2:
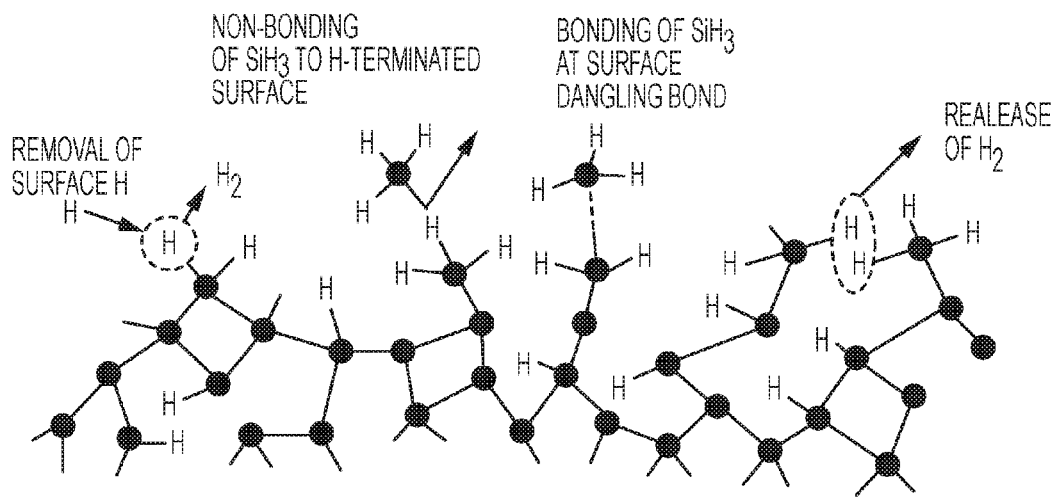
FIG. 2 depicts a diagram illustrating passivation of amorphous silicon with hydrogen according to one or more embodiments.

Dangling bonds in the amorphous silicon are responsible for the defect states in amorphous silicon. According to the present disclosure, hydrogen is included in the amorphous silicon to passivate dangling bonds of the amorphous silicon, thereby reducing its conductance, as well as reducing the ability of the resulting hydrogenated amorphous silicon encapsulating layer to provide a parasitic current path to the MTJ. FIG. 2 depicts a diagram illustrating the passivation of amorphous silicon with hydrogen according to one or more embodiments. Hydrogenation passivates the dangling bonds and reduces the hopping conduction, thereby increasing the resistivity in the undoped state of the amorphous silicon. By introducing hydrogen, the dangling bonds that are responsible for the defect states are passivated allowing hydrogenated amorphous silicon to perform like a semiconductor.

Figure 3:
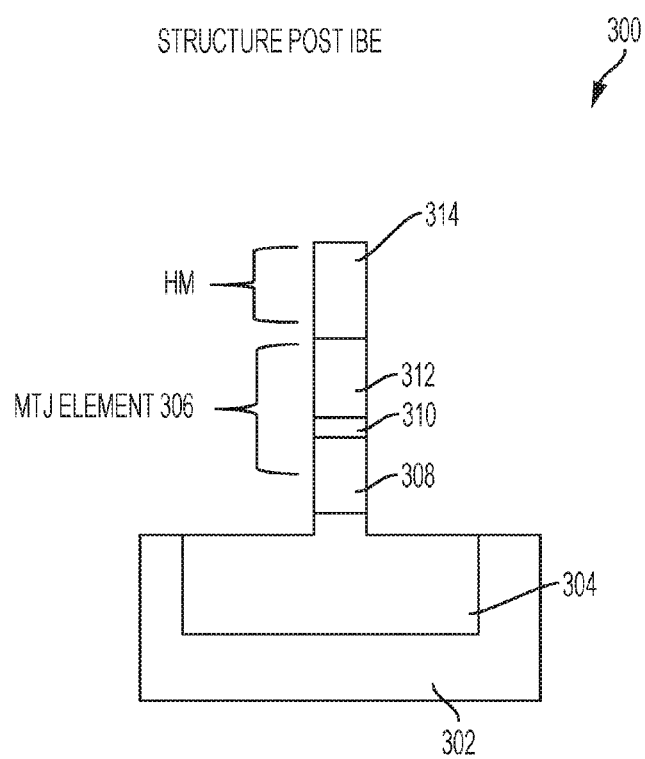
FIG. 3 depicts a cross-sectional view of a memory cell structure after a fabrication stage according to one or more embodiments.
Figure 4:
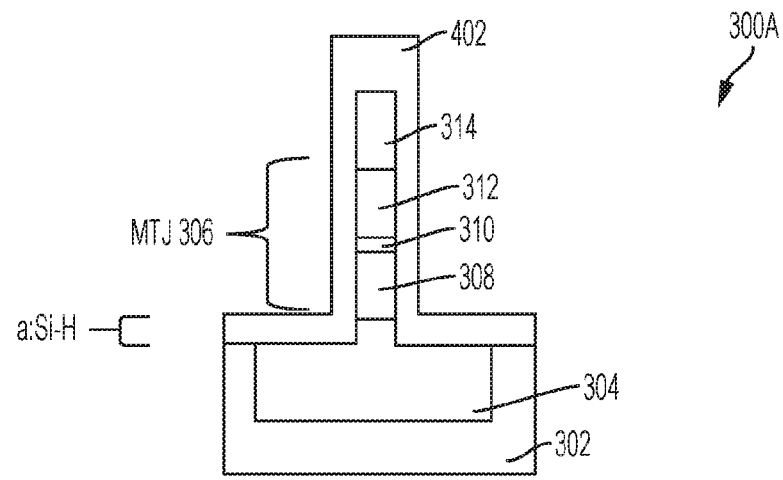
FIG. 4 depicts a cross-sectional view of a memory cell structure after another fabrication stage according to one or more embodiments.
Figure 5:
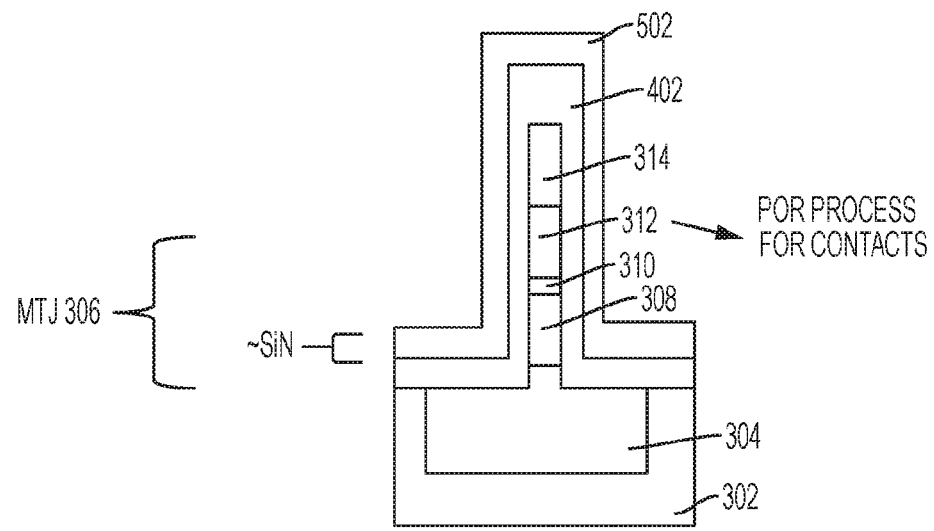
FIG. 5 depicts a cross-sectional view of a memory cell structure after another fabrication stage according to one or more embodiments.
Figure 6:
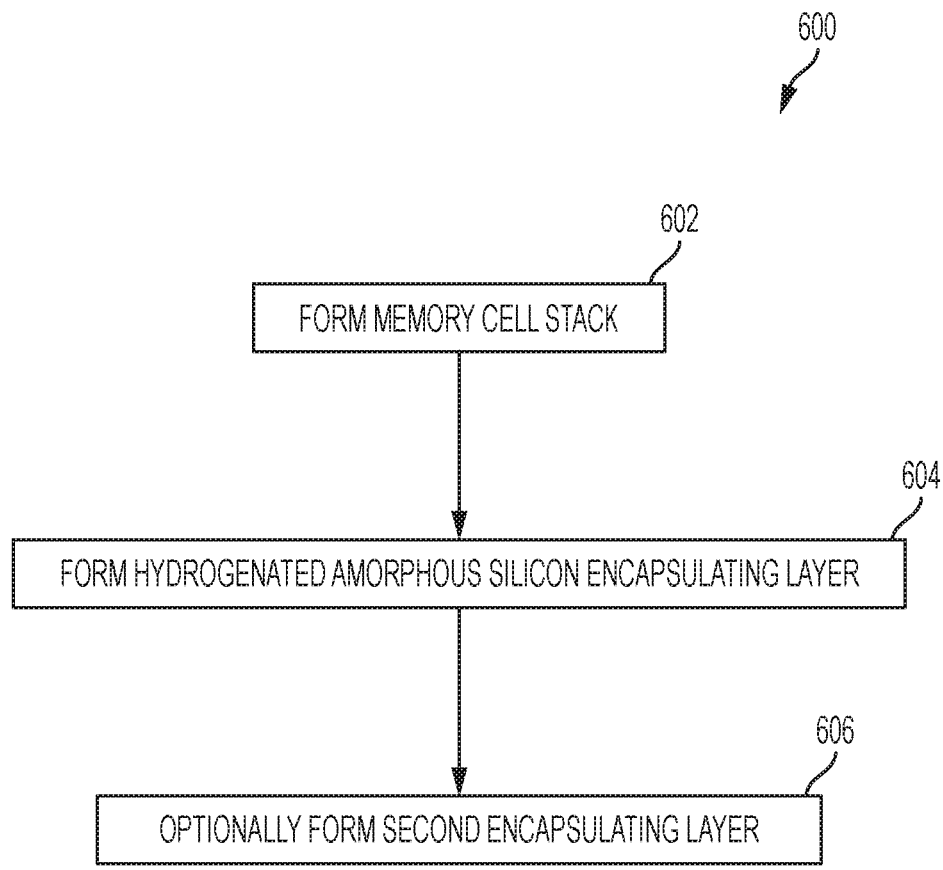
FIG. 6 depicts a flow diagram illustrating a methodology according to one or more embodiments.

A fabrication methodology for forming various stages of memory cell structures 300A, 300B (shown in FIGS. 4 and 5), each having a hydrogenated amorphous silicon encapsulation layer 402 in accordance with one or more embodiments of the present disclosure, will now be described with reference to FIGS. 3-6. More specifically, FIGS. 3-5 illustrate intermediate memory cell structures 300, 300A, 300B after various fabrication stages, and FIG. 6 depicts operations of a fabrication methodology 600 that corresponds to the fabrication stages shown in FIGS. 3-5. The following description will refer simultaneously to both the fabrication stages depicted in FIGS. 3-5 and the corresponding operation(s) of methodology 600 depicted in FIG. 6. The dimensions shown in FIGS. 3-5 are provided as non-limiting examples.

As shown in FIG. 3, memory cell 300 is a stack/pillar structure that includes a substrate 302, a bottom electrode 304, a hard mask (HM) layer 314 and a MTJ memory cell element 306 having reference layer 308, a tunneling barrier 310 and a free layer 312, configured and arranged as shown. Memory cell 300 is formed and patterned into a stack/pillar configuration using various known fabrication methods, including but not limited to photolithography and reactive ion etching (RIE) (block 602). In one or more embodiments of the present disclosure, a combination of photolithography, multiple-stage RIE and ion beam etching (IBE) are used. More specifically, memory cell structure 300 may be formed using magnetic film stack deposition technological, which uses known tools capable of achieving large area depositions of extremely uniform films with well-controlled thickness. Tunnel barrier 310 may be formed by depositing a thin aluminum layer, followed by exposure to an oxidizing plasma. IBE may be used to form the stack structure of memory cell 300.

FIG. 4 depicts memory cell 300A after deposition of an encapsulation layer 402 over memory cell 300 (block 604) using a PECVD process. In accordance with one or more embodiments, encapsulation layer 402 is formed from hydrogenated amorphous silicon (a:Si—H). PECVD is a process used to deposit thin films from a gas state (vapor) to a solid state on a substrate. Chemical reactions are involved in the process. The reactions occur after creation of a plasma of the reacting gases. The amorphous silicon component of hydrogenated amorphous silicon encapsulating layer 402 improves the coercivity of the MTJ, which is desirable. The hydrogen component of hydrogenated amorphous silicon encapsulation layer 402 passivates dangling bonds of the amorphous silicon component, thereby reducing its conductance and allowing it to perform like a non-amorphous semiconductor. The reduced conduction reduces the ability of the resulting hydrogenated amorphous silicon encapsulating layer 402 to provide a parasitic current path to MTJ element 306.

FIG. 5 depicts memory cell 300B after the optional deposition of a second encapsulating layer 502 over encapsulating layer 402 (block 606). Second encapsulating layer 502 may be a silicon-nitride film deposited using PECVD at 150 Celsius to 200 Celsius wafer temperature using process gasses of $SiH_4$, $NH_3$, $N_2$ and Ar. The encapsulated memory cells 300A, 300B may then be embedded into the BEOFL of a standard CMOS process route.

Thus it can be seen from the foregoing detailed description that the present disclosure provides an electromagnetic memory device having a memory cell and an encapsulation layer formed over the memory cell. The memory cell may include a MTJ, and the encapsulation layer may be formed from a layer of hydrogenated amorphous silicon. Amorphous silicon improves the coercivity of the MTJ but by itself is conductive. Adding hydrogen to amorphous silicon passivates dangling bonds of the amorphous silicon, thereby reducing its conductance, as well as reducing the ability of the resulting hydrogenated amorphous silicon layer to provide a parasitic current path to the MTJ. The hydrogenated amorphous silicon layer may be formed using a PECVD, which can be tuned to enable a hydrogen level of approximately 10 to approximately 20 percent. By keeping subsequent (i.e., BEOL) processing operations at or below about 400 Celsius, the resulting layer of hydrogenated amorphous silicon can maintain a post-BEOL hydrogen level at the pre-BEOL hydrogen level of approximately 10 to 20 percent.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A method of forming an electromagnetic memory device, the method comprising:
   forming a memory cell;
   forming an encapsulation layer over the memory cell; and
   forming the encapsulation layer from a layer of hydrogenated amorphous semiconductor material and wherein the memory cell comprises an active region; and the active region comprises a magnetic tunnel junction (MTJ).

2. The method of claim 1, wherein forming the layer of hydrogenated amorphous semiconductor material comprises:
   forming a layer of amorphous semiconductor material component;
   hydrogenating the layer of amorphous semiconductor material; and
   subsequent to the hydrogenating, performing remaining processing operations for forming the electromagnetic memory device at or below about 400 Celsius.

3. The method of claim 2, wherein the hydrogenating comprises a plasma enhanced chemical vapor deposition.

4. The method of claim 3, wherein:
   the layer of hydrogenated amorphous semiconductor material comprises a hydrogen component and an amorphous semiconductor material component; and
   the hydrogen component passivates dangling bonds of the amorphous semiconductor material component.

5. The method of claim 4, wherein the hydrogen component comprises from about 10 percent to about 20 percent of the layer of hydrogenated amorphous semiconductor material.

6. The method of claim 1 further comprising:
   forming an insulation layer over the encapsulation layer; wherein the insulation layer comprises silicon nitride.

7. An electromagnetic memory device comprising:
   a memory cell; and
   an encapsulation layer formed over the memory cell;
   wherein the encapsulation layer comprises a layer of hydrogenated amorphous semiconductor material and wherein the memory cell comprises an active region; and the active region comprises a magnetic tunnel junction (MTJ).

8. The device of claim 7, wherein:
   the layer of hydrogenated amorphous semiconductor material comprises a hydrogen component and an amorphous semiconductor material component; and
   the hydrogen component passivates dangling bonds of the amorphous semiconductor material component.

9. The device of claim 8, wherein the hydrogen component comprises from about 10 percent to about 20 percent of the layer of hydrogenated amorphous semiconductor material.

10. The device of claim 7 further comprising an insulation layer over the encapsulation layer.

11. The device of claim 10, wherein the insulation layer comprises silicon nitride.

12. The device of claim 7, wherein the MTJ comprises a free layer, a barrier layer and a reference layer.

13. An electromagnetic memory device comprising:
   a memory cell formed on a substrate;
   an encapsulation layer formed over the memory cell; and
   an insulation layer formed over the encapsulation layer;
   wherein the encapsulation layer comprises a layer of hydrogenated amorphous semiconductor material and wherein the memory cell comprises an active region; and the active region comprises a magnetic tunnel junction (MTJ).

14. The device of claim 13, wherein:
   the layer of hydrogenated amorphous semiconductor material comprises a hydrogen component and an amorphous semiconductor material component; and
   the hydrogen component passivates dangling bonds of the amorphous semiconductor material component.

15. The device of claim 14, wherein the hydrogen component comprises from about 10 percent to about 20 percent of the layer of hydrogenated amorphous semiconductor material.

16. The device of claim 13, wherein the insulation layer comprises silicon nitride.

17. The device of claim 13, wherein the MTJ comprises a free layer, a barrier layer and a reference layer.

* * * * *